US012761566B2

(12) United States Patent
Kao et al.

(10) Patent No.: US 12,761,566 B2
(45) Date of Patent: Oct. 13, 2026

(54) DIGITAL LITHOGRAPHY APPARATUS WITH IMAGING DEVICE POSITIONED TO MITIGATE MOIRE EFFECT

(71) Applicant: Applied Materials, Inc., Santa Clara, CA (US)

(72) Inventors: ChiaHung Kao, Keelung City (TW); Yen-Te Lee, Taoyuan (TW); Fuchyi Yang, San Jose, CA (US); Ulrich Mueller, Berkeley, CA (US); Wei-chung Chen, Kaohsiung City (TW)

(73) Assignee: Applied Materials, Inc., Santa Clara, CA (US)

( * ) Notice: Subject to any disclaimer, the term of this patent is extended or adjusted under 35 U.S.C. 154(b) by 102 days.

(21) Appl. No.: 18/775,420

(22) Filed: Jul. 17, 2024

(65) Prior Publication Data

US 2026/0023325 A1 Jan. 22, 2026

(51) Int. Cl.
*G03F 7/00* (2006.01)
*G02B 17/08* (2006.01)

(52) U.S. Cl.
CPC ...... *G03F 7/70116* (2013.01); *G02B 17/0856* (2013.01); *G03F 7/70325* (2013.01)

(58) Field of Classification Search
CPC ............. G03F 7/70116; G03F 7/70325; G02B 17/0856
See application file for complete search history.

(56) References Cited

U.S. PATENT DOCUMENTS 9,182,219 B1 * 11/2015 Manassen ............... H10P 74/27
11,965,835 B2 * 4/2024 Liu .................... G01N 21/9501
12,306,541 B2 * 5/2025 Swillam .............. G03F 7/70258
2012/0154595 A1 6/2012 Sassi
2018/0088347 A1 * 3/2018 Van Der Zouw ... G02F 1/13306
2024/0184215 A1 * 6/2024 Lian .................... G03F 7/70491

FOREIGN PATENT DOCUMENTS

WO 2006/129797 A1 7/2006

* cited by examiner

*Primary Examiner* — Hung V Nguyen
(74) *Attorney, Agent, or Firm* — Lowenstein Sandler LLP

(57) ABSTRACT

A digital lithography system includes a light source configured to emit a light beam along an optical path toward a substrate via one or more optical elements. The digital lithography system further includes a digital micro-mirror device (DMD) configured to receive the light beam and form an output light beam. The output light beam is emitted along the optical path toward the substrate. The digital lithography system further includes an imaging device configured to capture an image of the substrate illuminated at least in part by the output light beam. A first optical path length corresponding to the DMD and a second optical path length corresponding to the imaging device are unequal.

20 Claims, 5 Drawing Sheets

200A

200B

DIGITAL LITHOGRAPHY APPARATUS WITH IMAGING DEVICE POSITIONED TO MITIGATE MOIRE EFFECT

TECHNICAL FIELD

Embodiments of the present disclosure relate to a digital lithography apparatus having an imaging device positioned to mitigate Moire effect and methods of setting up and using such a digital lithography apparatus.

BACKGROUND

Photolithography is widely used in the manufacturing of semiconductor devices and display devices, such as liquid crystal displays (LCDs) and organic light emitting diode displays (OLED). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Digital lithography techniques are generally employed to create electrical features incorporated as part of the liquid crystal material layer forming the pixels of displays. According to this technique, a light-sensitive photoresist is typically applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

The Moire effect is a visual phenomenon that occurs when two grids or patterns with regular spacing are overlaid at a slight angle or with a slight difference in size. This interaction creates a new pattern, often characterized by large-scale, wavy, or rippled designs, which are not present in the original patterns.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

Some embodiments described herein are directed to a digital lithography system. The digital lithography system includes a light source configured to emit a light beam along an optical path toward a substrate via one or more optical elements. The digital lithography system further includes a digital micro-mirror device (DMD) configured to receive the light beam and form an output light beam. The output light beam is emitted along the optical path toward the substrate. The digital lithography system further includes an imaging device configured to capture an image of the substrate illuminated at least in part by the output light beam. A first optical path length corresponding to the DMD and a second optical path length corresponding to the imaging device are unequal.

Additional embodiments described herein are directed to a system. The system includes a light source configured to emit a beam of light. The system further includes a digital micro-mirror device (DMD) configured to receive the beam of light and form an output light beam. The system further includes one or more optical elements configured to direct the output light beam along an optical path to a surface of a substrate. The system further includes an image sensor configured to capture an image of the substrate illuminated by the output light beam. A first optical path length corresponding to the DMD and a second optical path length corresponding to the image sensor are unequal.

Further embodiments described herein are directed to a method. The method includes illuminating, by a first light source configured to output a beam of light, at least a portion of a substrate with an output light beam. The output light beam is formed by a digital micro-mirror device (DMD) having a first optical path length. The method further includes capturing, by an imaging device having a second optical path length, an image of a substrate illuminated by the light beam. The method further includes determining, by a processing device, whether the image of the substrate includes a Moire effect. Responsive to determining that the image of the substrate includes the Moire effect, the method further includes adjusting the second optical path length. The first optical path length and the adjusted second optical path length are unequal.

Numerous other features are provided in accordance with these and other aspects of the disclosure. Other features and aspects of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
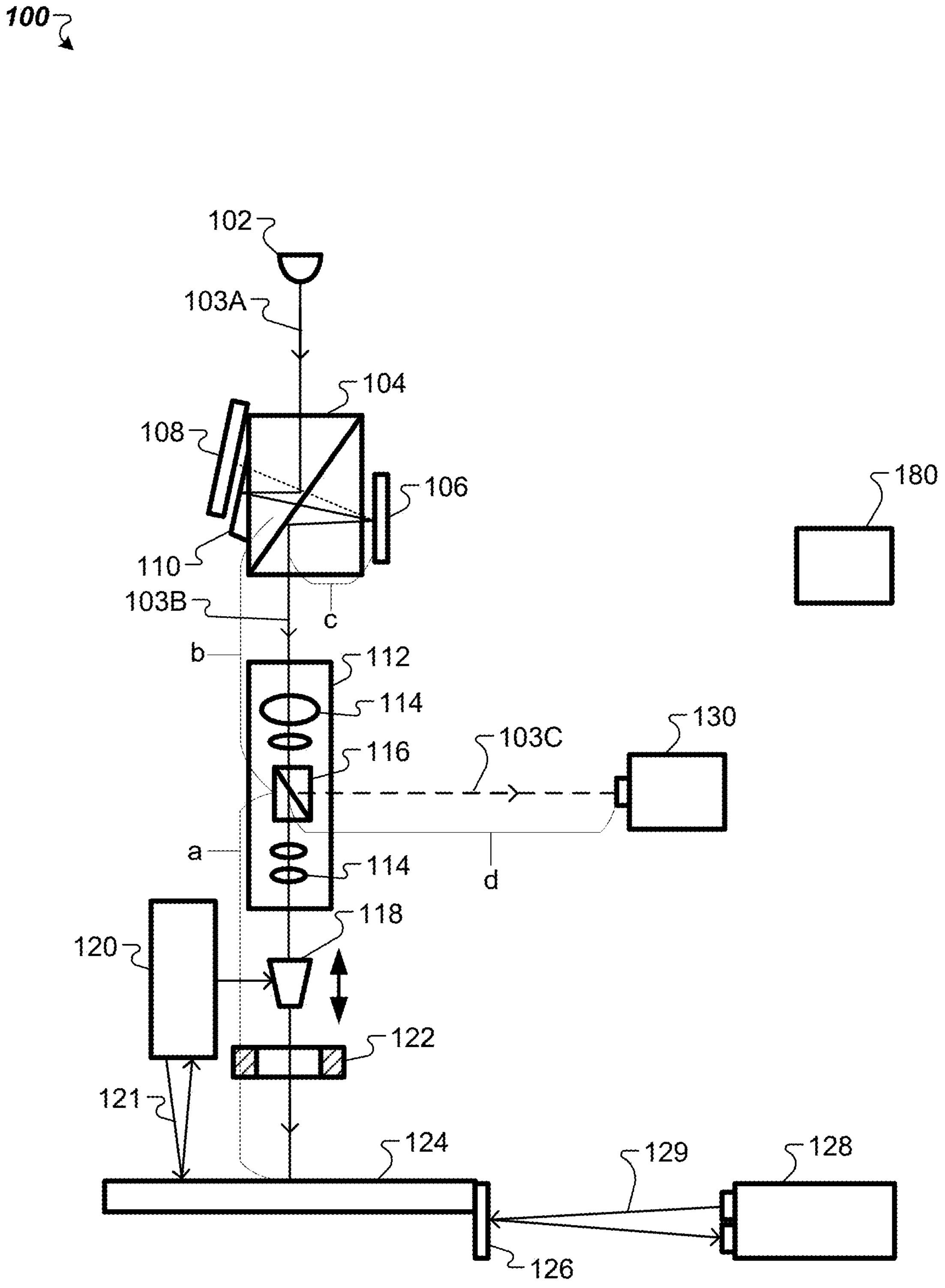
FIG. 1 shows a schematic of a digital lithography system in accordance with one or more embodiments of the preset disclosure.

Embodiments of the present disclosure relate to a digital lithography apparatus having an imaging device positioned to mitigate Moire effect. Digital lithography systems and methods described herein print device structures on a substrate (e.g., a glass substrate, a wafer, etc.) using a light source. Digital lithography systems and methods as described herein are used to manufacture displays and/or semiconductors, among other things, such as advanced packaging devices, etc. Advanced packaging may include devices packaged using techniques such as system-in-package (SiP), 3D packaging, wafer-level packaging (WLP), fan-out wafer-level packaging (FO-WLP), chip-on-wafer-on-substrate (CoWoS), embedded die packaging, heterogeneous integration, and/or flip-chip technology.

In some examples, a customer may order 5,000 pieces and provide a pattern to a manufacturer for these 5,000 pieces. The manufacturer may form a few hundred of those patterns per substrate. The same manufacturing process may be repeated, for example, 100 times or 200 times. The manufacturer typically scans the first substrate as an initial reference scan. However, each substrate (e.g., glass) may be slightly different and the position may be slightly skewed one way or the other with some misalignment from machine to machine. To mitigate misalignment, prior to patterning the substrate, an imaging device is used to capture an image of a reference marking on a surface of the substrate. The image of the reference marking may be used to correct the alignment of the substrate so that the patterning of the substrate is performed without the misalignment.

While capturing the image of the reference marking, the surface of the substrate may be illuminated with the patterned light or with unpatterned light. In some embodiments, the light is output by a digital micro-mirror device (DMD) which may receive a light beam from a light source and optionally pattern the light beam to form a patterned light beam. The DMD may output a patterned light beam or an unpatterned light beam. The patterned or unpatterned light beam may be used to illuminate the substrate (e.g., to illuminate the reference mark on the substrate, etc.). Conventionally, so that the image of the reference mark is in focus, an imaging device used to capture the image of the reference mark has the same optical path length (e.g., focal length, etc.) as the DMD. For example, the DMD may have a first optical path length and the imaging device may have a second optical path length that is the same as the first optical path length. In some embodiments, an autofocus system is used to both focus the patterned light beam or unpatterned light beam from the DMD and to focus the light reflected from the surface of the substrate to the imaging device (e.g., so that the image is in focus).

However, in systems where the DMD and the imaging device have the same optical path length, images captured by the imaging device may include the Moire effect. The Moire effect is a visual phenomenon that occurs when two grids or patterns with regular spacing are overlaid at a slight angle or with a slight difference in size. This interaction creates a new pattern, often characterized by large-scale, wavy, or rippled designs, which are not present in the original patterns. The Moire effect in images of the substrate (e.g., images of the reference mark(s) on the substrate) may make alignment of the substrate difficult. For example, the Moire effect may make it difficult to determine the precise location and/or orientation of the reference mark. Therefore, alignment of the substrate may be unreliable because of the Moire effect.

Systems and methods described herein mitigate the Moire effect by providing a digital lithography system having that includes shared optics for imaging of a substrate and for patterning of the substrate. The digital lithography system may include an imaging device (e.g., a camera, etc.) and a DMID that have one or more shared optical elements. The imaging device is not parfocal with the DMD in some embodiments. For example, and in some embodiments, an imaging device of a digital lithography system described herein has a optical path length different from a optical path length of a DMD. The system described herein may be capable of capturing high-quality images of substrates (e.g., of substrate reference mark(s), etc.) while not adversely affecting printing performance. Therefore, precision and accuracy of substrate alignment based on captured images can be improved.

In some embodiments, a digital lithography system includes a light source configured to emit a light beam. The light source may be a light-emitting diode (LED), a laser diode, a laser and/or another light source that is to emit a beam of light. The light source may emit the light beam toward a substrate along an optical path. One or more optical elements (e.g., such as one or more lenses, prisms, mirrors, etc.) may guide the light beam along the optical path toward the substrate. In some embodiments, the digital lithography system includes a DMD. The DMD may be configured to receive and pattern the light beam to form a patterned light beam and/or to output an unpatterned light beam (e.g., depending on a mode of operation). The DMD may pattern the light beam when the DMD is "on." The patterned light beam may be emitted (e.g., by the DMD) along the optical path toward the substrate. In some embodiments, the DMD may have a first optical path length. For example, the distance along the optical path from the DMD to the surface of the substrate may be a first distance. The patterned light beam may be directed to the surface of the substrate by the one or more optical elements. In some embodiments, the patterned light beam is focused onto the surface of the substrate by a movable lens.

In some embodiments, the surface of the substrate may be illuminated, at least in part, by the patterned or unpatterned light beam. During patterning operations, the light beam may be a pattern light beam having a wavelength and/or energy that changes one or more properties (e.g., cures, etc.) areas of a photoresist that are exposed to the light beam. During imaging operations, the light beam may be a patterned or unpatterned light beam having a wavelength that does not change properties of the photoresist that are exposed to the light beam. The surface of the substrate may be additionally illuminated by one or more other light sources. In some embodiments, the digital lithography system includes an imaging device. The imaging device may be a device such as a camera or other image sensor, etc. The imaging device may be configured to capture an image of the substrate during an imaging operation. Light reflected from the surface of the substrate may be captured by the imaging device to form the image. In some embodiments, the reflected light is focused (e.g., to the imaging device) by the movable lens. In some embodiments, the imaging device has a second optical path length that is different than (e.g., greater than or lesser than) the first optical path length. For example, the distance along an optical path between the surface of the substrate and the imaging device may be a second distance. In some embodiments, the second optical path length corresponding to the imaging device and the first optical path length corresponding to the DMD are unequal. For example, the first distance along the optical path may be different than the second distance. The difference between the first optical path length and the second optical path length may mitigate and/or at least partially eliminate the Moire effect from images of the substrate captured by the imaging device.

Embodiments of the present disclosure provide advantages over other digital lithography systems. By providing a system that can mitigate, eliminate and/or at least partially eliminate the Moire effect from captured images, the substrate can be more accurately and precisely aligned for patterning. Alignment of substrates may be more repeatable using a system as described herein because of the improved image quality by the imaging device. Therefore, more patterns can be included on an individual substrate without patterning errors, ultimately leading to greater system throughput.

FIG. 1 shows a schematic of a digital lithography system 100 in accordance with one or more embodiments of the preset disclosure. In some embodiments, a first light source 102 emits a light beam 103A toward the surface of a substrate 124. The light beam 103A may be coherent light beam or a non-coherent light beam. The light beam 103A may be emitted from the light source 102 along an optical path. The light source 102 may be a laser (e.g., an excimer laser, an F2 laser, etc.), a mercury vapor lamp, an extreme ultraviolet light source, a light emitting diode (LED) or other solid state light source, and or other type of light source in some embodiments. The substrate 124 may be formed of suitable materials including, but not limited to, glass, a reflective material, a metal, chrome, a polymer, a crystal, silicon, or an oxide. In some embodiments, the light beam 103A enters into a frustrated cube 104. The frustrated cube 104 may be a prism configured to direct the light beam 103A toward a mirror 110 disposed on a first side of the frustrated cube 104. The mirror may reflect the light beam 103A toward a DMD 106 disposed on a second side the frustrated cube 104 opposite the first side. When the DMD 106 is "off" (e.g., when a pixel or mirror of the DMD is off), the DMD (or pixel or mirror of the DMD) may reflect the light beam 103A toward a light absorber device 108 (e.g., a beam absorber, a beam "dump," etc.). When the DMD 106 is "on" (e.g., when a pixel or mirror of the DMD is on), the one or more "on" mirrors or pixels of the DMD 106 may reflect the beam toward the substrate. By selectively turning on and off various mirrors of the DMD 106, the DMD 106 patterns the light beam 103A to form a patterned light beam. In some embodiments, the DMD 106 produces an output light beam 103B. The output light beam 103B may be patterned or unpatterned as described herein. The output light beam 103B may be directed, by the frustrated cube 104, along the optical path toward the substrate 124.

The DMD 106 may operate by modulating incoming light and creating a pattern (e.g., output light beam 103B) using many small mirrors. The DMD 106 may include an array of small mirrors (e.g., microscopic mirrors, etc.) which can tilt and/or hinge. The number and/or size of mirrors in the array of mirrors corresponds to the resolution of the device. For example, in a 1920×1080 pixel array, there are 2,073,600 mirrors. Each mirror can tilt to one of two positions: "on" or "off." In the "on" position, the mirror directs light toward a projecting lens. In the "off" position, the mirror reflects light away from the lens. This tilting mechanism allows for precise control of light intensity for each pixel. The light reflected by the mirrors in the "off" position may be reflected toward the light absorber device 108.

In some embodiments, the output light beam 103B is magnified by reduction optics 112. Reduction optics 112 may include an arrangement of lenses 114 and/or a prism 116. The lenses 114 may include convex and/or concave lenses to manipulate the output light beam 103B and/or direct the output light beam 103B toward the substrate 124 along the optical path. In some embodiments, the prism 116 is configured to direct the output light beam 103B toward the substrate 124. In some embodiments, the prism 116 is configured to direct light reflected from the substrate 124 (e.g., reflected light 103C) toward an imaging device 130. More details regarding the reflected light 103C and the imaging device 130 are provided herein below.

In some embodiments, the output light beam 103B is directed toward one or more movable lens(es) 118. The movable lens(es) 118 may include an optical lens, a spherical lens, and/or an aspherical lens. The movable lens(es) 118 may be movable by an actuator, such as a piezo actuator. An autofocus module 120 may be used to control the position of the movable lens 118 (e.g., via the actuator). In some embodiments, the module 120 uses a laser beam 121 or other distance detector to determine the distance between the surface of the substrate 124 and the lens 118. For example, and in some embodiments, the module 120 emits the laser beam 121 (e.g., via an emitter). The laser beam 121 is reflected off of the surface of the substrate 124 back toward the module 120. The module 120 may collect the reflected laser beam 121 (e.g., via a receptor, via a collector, etc.) to determine the distance between the module 120 and the surface of the substrate 124. The relative position of the movable lens 118 with respect to the module 120 may be known, so the module may determine the distance between the surface of the substrate 124 and the lens 118.

In some embodiments, the movable lens 118 is moved (e.g., by the actuator) in a z direction (e.g., vertically) so that the output light beam 103B is in-focus on the surface of the substrate 124 during patterning operations. For example, the lens 118 may be moved up or down relative to the substrate 124 so that the output light beam 103B can be focused on the substrate surface. In some embodiments, the output light beam 103B passes through a second light source 122. The light source 122 may include a center cut-out and/or passage so that the output light beam 103B can pass through uninterrupted. In some embodiments, the light source 122 is substantially ring-shaped and surrounds the output light beam 103B. The light source 122 may include one or more LEDs. In some embodiments, bright field illumination of the surface of the substrate 124 is provided by the light source 102 (e.g., via the output light beam 103B) while dark field illumination of the surface of the substrate 124 is provided by the light source 122.

In some embodiments, the substrate 124 is disposed on a stage (not illustrated). A mirror 126 may be coupled to the stage. In some embodiments, the movement and position of the stage is controlled, e.g., such as by a controller 180. In some embodiments, the position of the stage is determined by using a laser interferometer 128. The laser interferometer 128 may emit a laser beam 129 which is reflected off of the mirror 126 back to the interferometer 128. Based on one or more sensor measurements by the laser interferometer 128, the controller 180 can determine the position of the stage. The controller 180 may cause the stage to move (e.g., via one or more actuators, etc.) to move the substrate 124 with respect to the output light beam 103B.

During patterning operations, the projected light pattern is focused and output onto the substrate 124 to expose a portion of the substrate 124 to the light pattern and cure the exposed portion of the substrate. The substrate 124 may include a photoresist thereon, and the light pattern may selectively cure portions of the photoresist to impart the projected light pattern onto the substrate at the exposed portions.

Prior to performing patterning of a portion of the substrate, an imaging operation may be performed to identify alignment marks on the substrate and properly position the substrate relative to the patterned light beam (e.g., by moving the substrate 124 using a stage that is moveable along x and y (and possibly z) axes.

In some embodiments, during an imaging operation, light reflected from the surface of the substrate 124 is directed back toward the reduction optics 112. The light used for the imaging operations may be different than the light used for the patterning operations. For example, the light used for the imaging operations may have a different wavelength, different intensity, etc. than the light used for the patterning operations, and may not cure the photoresist on the substrate 124. The light used for the imaging operations may or may not be patterned light.

The reflected light may pass through the movable lens 118. In some embodiments, the prism 116 directs the reflected light 103C toward the imaging device 130. The imaging device 130 may be an image sensor or a camera, etc. The imaging device 130 may be capable of capturing images. In some embodiments, the imaging device 130 captures an image of the substrate 124 by collecting the reflected light 103C. In some embodiments, the controller 180 receives the captured image of the substrate 124. The controller 180 may determine whether the captured image of the substrate is in focus. Based on whether the captured image is in focus, the controller 180 may cause the movable lens 118 to move up or down. For example, and in some embodiments, responsive to determining the captured image of the substrate is not in focus, the controller 180 may send a signal to the module 120 to cause the movable lens 118 to move up or down to focus the reflected light 103C. A new image may be captured by the imaging device 130 that is in focus.

In some embodiments, the DMD 106 and the imaging device 130 have different optical path lengths. The optical path length of the DMD 106 may correspond to the distance along the optical path from the DMD 106 to the surface of the substrate 124. The optical path length of the imaging device 130 may correspond to the distance the reflected light 103C travels from the surface of the substrate 124 to the prism 116 added to the distance from the prism 116 to the imaging device 130. For example, the DMD 106 may have a optical path length of distances a+b+c, while the imaging device 130 may have a optical path length of distances a+d, where $a+b+c \neq a+d$. In some embodiments, the difference between the optical path length of the DMD 106 and the optical path length of the imaging device 130 mitigates the Moire effect with respect to the captured image of the substrate 124. By having the focal distance of the DMD (that outputs the light used to illuminate the substrate during imaging operations) and the image sensor 130, the output light and the image sensor are not in focus at the same time. Placing the image sensor 130 into focus causes the light to become out of focus due to the difference in the optical path lengths between the image sensor and the DMD. Since the light is out of focus when the image sensor is in focus, the Moire effect can be mitigated or eliminated for captured images.

The difference between the optical path length of the DMD 106 and the optical path length of the imaging device 130 may be determined by experimentation. In some embodiments, the DMD 106 and the imaging device 130 are initially set so that their respective optical path lengths are equal. For example, the DMD 106 is initially set having a first optical path length and the imaging device is initially set having a second optical path length, the first and second optical path lengths being equal. In some embodiments, the surface of the substrate 124 is illuminated with the output light beam 103B. An image of the substrate 124 is captured with the imaging device 130. A processing device of the controller 180 receives the captured image and determines whether the image includes the Moire effect. Responsive to determining the image includes the Moire effect, the second optical path length (e.g., the optical path length of the imaging device 130) may be adjusted. For example, distance d can be shortened or lengthened so that $a+b+c \neq a+d$. In some embodiments, the controller 180 causes the movable lens 118 to move from a first position associated with the second optical path length (e.g., the initial optical path length of the imaging device 130) to a second position associated with the adjusted second optical path length (e.g., the adjusted optical path length of the imaging device 130). Moving of the movable lens 118 may be to focus the reflected light 103C to the imaging device 130. In some embodiments, another image of the substrate 124 is captured. The image may lack the Moire effect. If the processing device of the controller 180 determines the image does not lack the Moire effect, the optical path length of the imaging device 130 is adjusted again. This process may be repeated until the captured image(s) of the substrate 124 lack the Moire effect.

During operation of the system 100, after the optical path length of the imaging device 130 is adjusted to mitigate the Moire effect, the movable lens 118 is movable between the second position and a third position. In the third position, the movable lens 118 is positioned to focus the output light beam 103B onto the surface of the substrate 124. In the second position, the movable lens 118 is positioned to focus the reflected light 103C so that the imaging device 130 can capture an image that is “in focus.” In some embodiments, the controller 180 sends a signal to the module 120 to cause the movable lens 118 to be moved to a position associated with the optical path length of the DMD 106 to focus the output light beam 103B onto the substrate 124. In some embodiments, an exposure operation is performed with respect to the substrate 124 by emitting the output light beam 103B onto the substrate. The output light beam 103B may be focused by the movable lens 118. In some embodiments, the controller 180 sends a signal to the module 120 to cause the movable lens 118 to be moved to a position associated with the adjusted optical path length of the imaging device 130 to focus the reflected light 103C to the imaging device 130. The substrate 124 may still be illuminated at least partially by the output light beam 103B, but the light beam may be unfocused because the movable lens 118 is in position to focus the reflected light 103C, not in position to focus the output light beam 103B. In some embodiments, the imaging device 130 captures an image of the substrate 124. The image of the substrate may be “in focus.” In some embodiments, the captured image lacks the Moire effect.

Figure 2A:
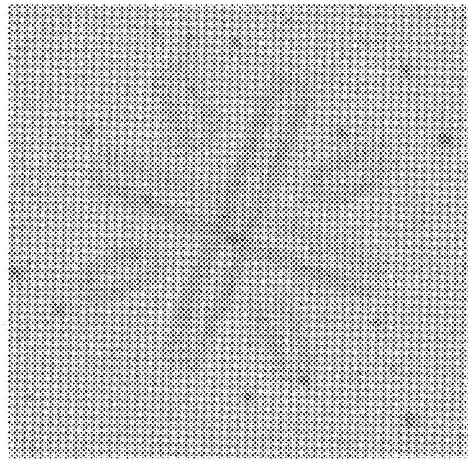
FIGS. 2A-2B are examples of captured images, in accordance with one or more embodiments of the present disclosure.
Figure 2B:
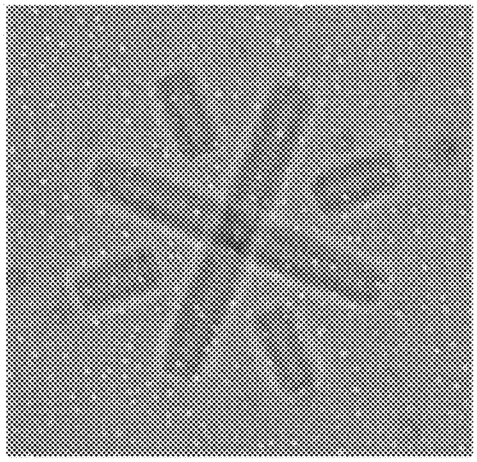

FIGS. 2A-2B are examples of captured images, in accordance with one or more embodiments of the present disclosure. Referring to FIG. 2A, an example of a captured image 200A of a reference mark on a surface of a substrate is shown. In some embodiments, image 200A includes the Moire effect and was captured by a digital lithography system for which the DMD and image sensor have a same optical path length. The faint grid shown in image 200A may be caused by interference of light, which may be caused by the Moire effect. In some embodiments, the reference mark is at least partially obscured because of the Moire effect. Obscurement of the reference mark may lead to difficulties in aligning the substrate for processing.

Referring to FIG. 2B, an example of a captured image 200B of a reference mark on a surface of a substrate is shown. In some embodiments, image 200B lacks the Moire effect and was captured by a digital lithography system for which the DMD and image sensor have different optical path lengths, such as system 100 described herein above. Unlike image 200A, image 200B does not include gridding caused by interference of light. The reference mark shown in image 200B may be more clear than the reference mark shown in image 200A. Therefore, aligning the substrate based on image 200B may be more easily, accurately, and precisely accomplished than based on image 200A.

Figure 3A:
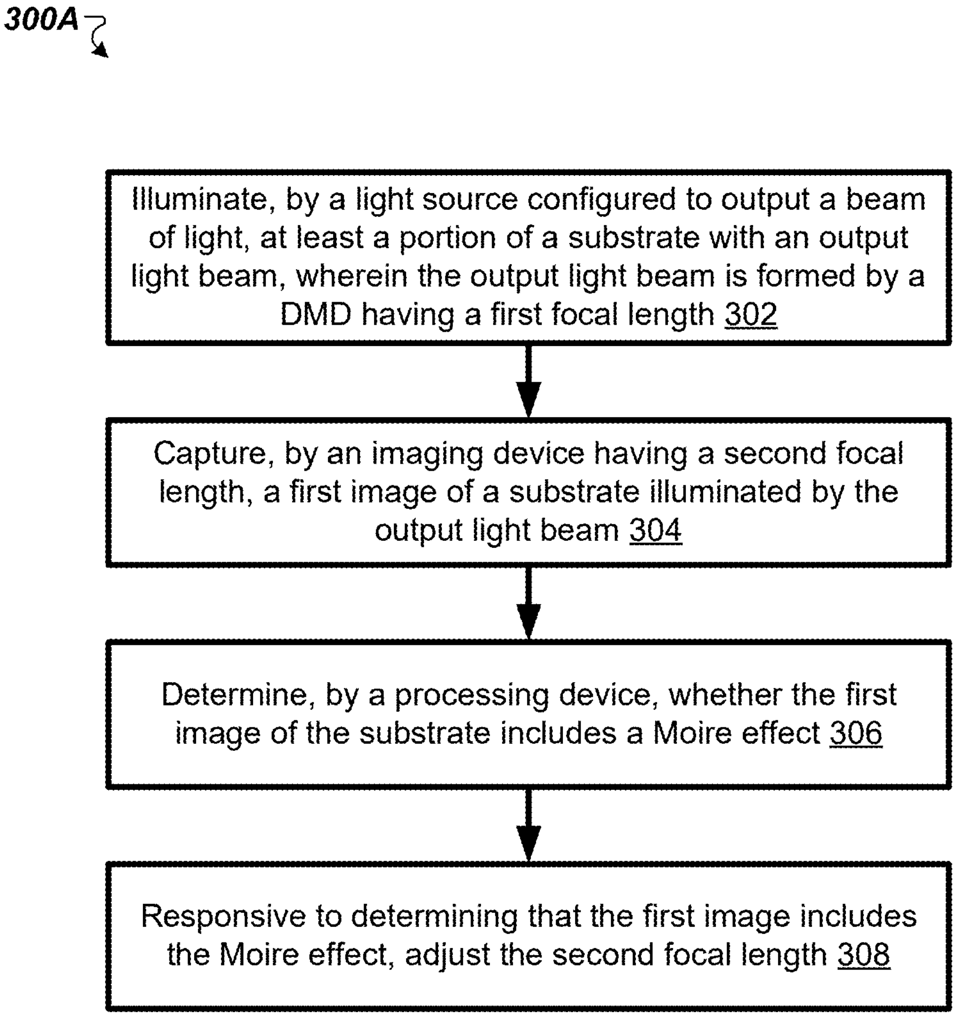
FIGS. 3A-3B are flow diagrams of example methods for implementing a digital lithography system, in accordance with one or more embodiments of the present disclosure.

FIG. 3A is a flow diagram of an example method 300A for configuring a digital lithography system (e.g., such as system 100 described herein above), in accordance with one or more embodiments of the present disclosure.

At block 302, a light source configured to output a beam of light is used to illuminate at least a portion of a substrate with an output light beam. The output light beam may be a patterned or unpatterned light beam. In some embodiments, the output light beam is formed by a DMD. For example, the light source may emit a beam of light. The beam of light may be received by a DMD, such as via one or more lenses, prisms, etc. Multiple mirrors (e.g., multiple microscopic mirrors, etc.) of the DMD may direct portions or all of the light beam along an optical path. The light beam directed by the mirrors of the DMD may comprise the output light beam. The output light beam may be directed along the optical path toward the substrate. In some embodiments, the DMD has a first optical path length (e.g., a first distance along the optical path from the DMD to the surface of the substrate).

At block 304, an imaging device is used to capture a first image of a substrate illuminated by the output light beam. The imaging device may be an image sensor or a camera, etc. Light reflected from the surface of the substrate may be directed to the imaging device, e.g., such as by one or more lenses and/or prisms, etc. In some embodiments, the first image is an image of one or more reference marks on the surface of the substrate. In some embodiments, the imaging device has a second optical path length (e.g., a second distance from the surface of the substrate to the imaging device). Initially, the second optical path length may be similar or the same as the first optical path length.

At block 306, a processing device is used to determine whether the first image includes a Moire effect. In some embodiments, processing logic analyzes the first image for superimposed networks of lines. The superimposed networks of lines may be caused by the Moire effect.

At block 308, responsive to the processing device determining that the first image includes the Moire effect, the second optical path length of the imaging device may be adjusted. For example, the second optical path length can be lengthened or shortened. Adjusting the second optical path length relative to the first optical path length may mitigate, reduce, and/or eliminate the Moire effect in any subsequent images captured using the imaging device when the substrate is illuminated with the light output by the DMD.

Figure 3B:
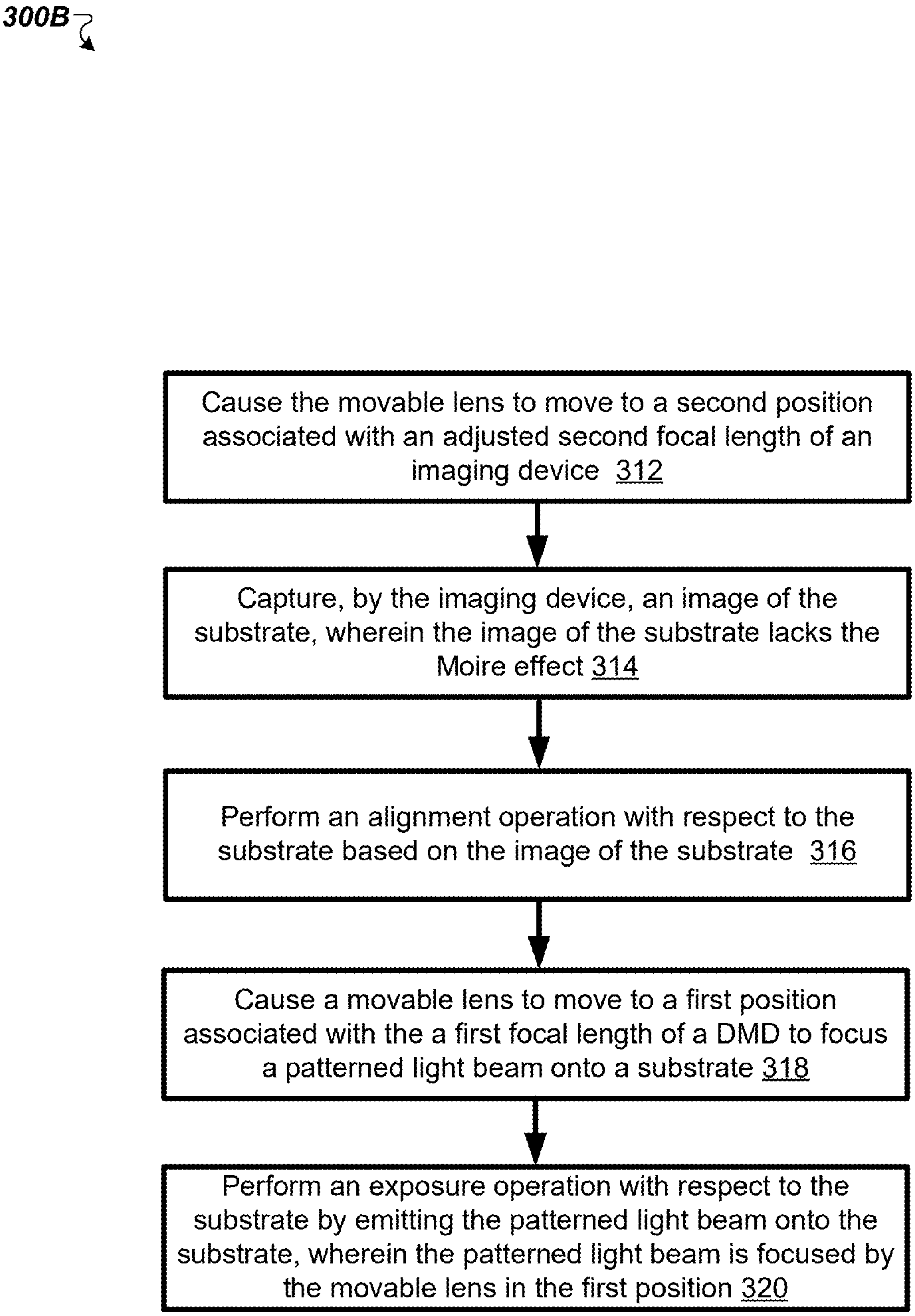

FIG. 3B is a flow diagram of an example method 300B for using a digital lithography system (e.g., such as system 100 described herein above) to capture images of a substrate, in accordance with one or more embodiments of the present disclosure. In some embodiments, method 300B is performed in conjunction with method 300A.

At block 312, the movable lens is caused to move from the first position to a second position (i.e., the second position described herein above with respect to FIG. 1) associated with an adjusted second optical path length of an imaging device (e.g., the second optical path length adjusted at block 308 of method 300A). In some embodiments, the movable lens is configured to focus light reflected from the surface of the substrate (e.g., to an imaging device) when the movable lens is in the second position. The second position may be closer to the substrate surface or further from the substrate surface than the first position. Because the imaging device and the DMD have different optical path lengths, the movable lens is moved to clearly focus the patterned light beam from the DMD in one position and to clearly focus the reflected light to the imaging device in another position. While the imaging device captures in image of the substrate, it may not be necessary to clearly focus the patterned light beam from the DMD onto the surface of the substrate, so the movable lens can be moved to instead focus the reflected light from the surface of the substrate.

At block 314, the imaging device is used to capture an image of the substrate. In some embodiments, the image lacks the Moire effect. At block 316, an alignment operation is performed with respect to the substrate based on the image of the substrate (e.g., the image captured at block 314). The alignment operation may include adjusting the position of the substrate, for example, by moving and/or by rotating the stage supporting the substrate.

At block 318, a movable lens is caused to move to a first position (i.e., the third position described herein above with respect to FIG. 1) associated with the first optical path length of a DMD to focus a patterned light beam onto a substrate. The movable lens may be moved by an actuator such as a piezo actuator, etc. In some embodiments, a control signal from an autofocus module causes the actuator to move the movable lens.

At block 320, an exposure operation is performed with respect to the substrate. The exposure operation may be performed by emitting the patterned light beam onto the substrate. The patterned light beam may be focused onto the surface of the substrate by the movable lens. In some embodiments, the movable lens is configured to focus the patterned light beam onto the surface of the substrate when the movable lens is in the first position.

Figure 4:
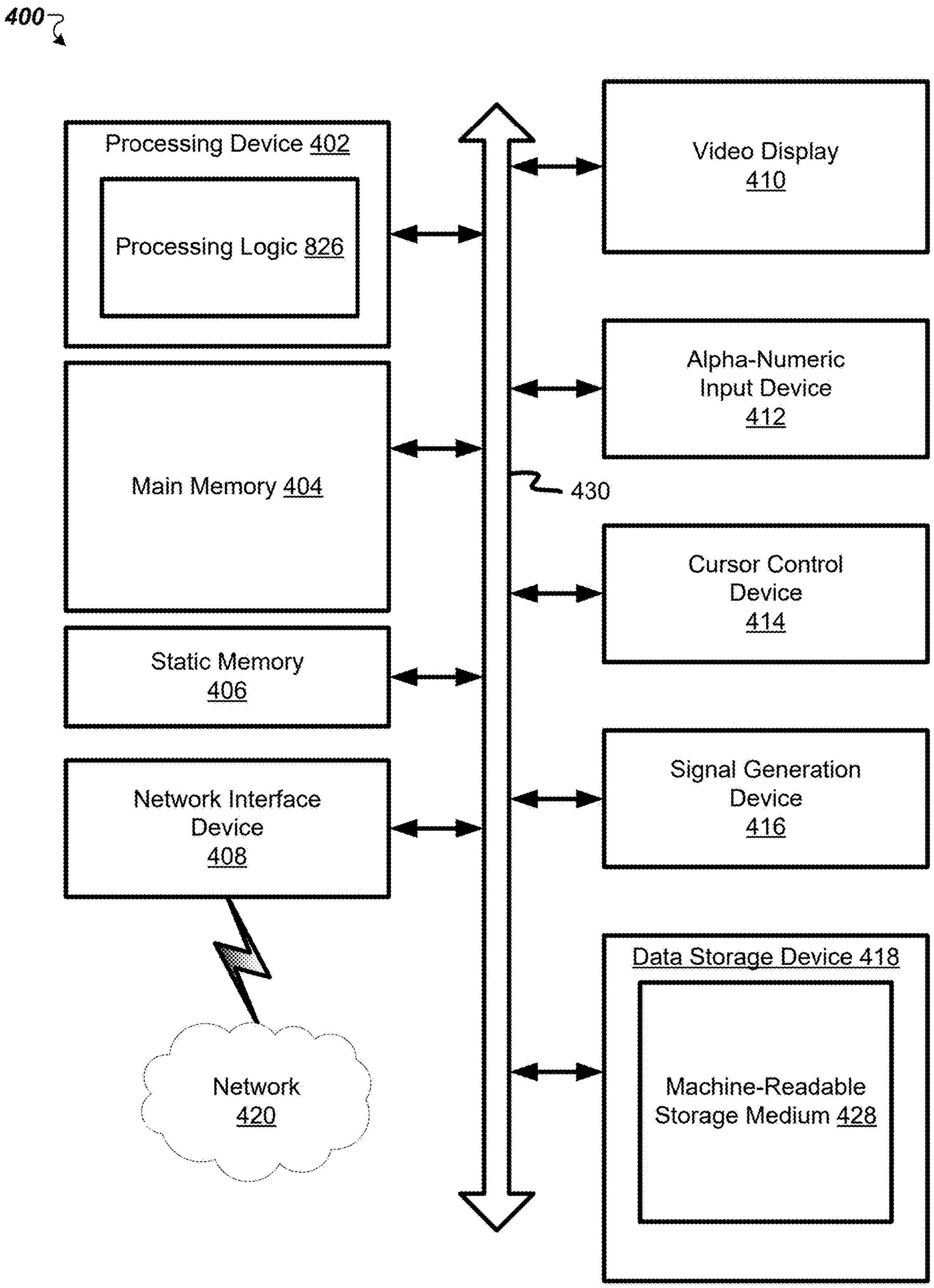
FIG. 4 depicts a diagram of an illustrative example of a computing system implementing the systems and methods described herein.

FIG. 4 depicts a diagram of an illustrative example of a computing system 400 implementing the systems and methods described herein, including a set of instructions executable by systems as described herein to perform any one or more of the methodologies discussed herein. In one implementation, the system may include instructions to enable execution of the processes and corresponding components shown and described in connection with FIGS. 1, 3A, and 3B.

In alternative implementations, the systems may include a machine connected (e.g., networked) to other machines in a LAN, an intranet, an extranet, or the Internet. The machine may operate in the capacity of a server machine in client-server network environment. The machine may be a personal computer (PC), a neural computer, a set-top box (STB), Personal Digital Assistant (PDA), a cellular telephone, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies described herein.

The example computer system 400 can include a processing device (processor) 402, a main memory 404 (e.g., read-only memory (ROM), flash memory, dynamic random access memory (DRAM) such as synchronous DRAM (SDRAM)), a static memory 406 (e.g., flash memory, static random access memory (SRAM)), and a data object storage device 418, which communicate with each other via a bus 430.

Processing device 402 represents one or more general-purpose processing devices such as a microprocessor, central processing unit, or the like. More particularly, the processing device 402 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 402 may also be one or more special-purpose processing devices such as an application specific integrated circuit (ASIC), a field programmable gate array (FPGA), a digital signal processor (DSP), network processor, or the like. In various implementations of the present disclosure, the processing device 402 is configured to execute instructions for the devices or systems described herein for performing the operations and processes described herein.

The computer system 400 may further include a network interface device 408. The computer system 400 also may include a video display unit 410 (e.g., a liquid crystal display (LCD) or a cathode ray tube (CRT)), an alphanumeric input device 412 (e.g., a keyboard), a cursor control device 414 (e.g., a mouse), and a signal generation device 416 (e.g., a speaker).

The data storage device 418 may include a computer-readable medium 428 on which is stored one or more sets of instructions of the devices and systems as described herein embodying any one or more of the methodologies or functions described herein. The instructions may also reside, completely or at least partially, within the main memory 404 and/or within processing logic 426 of the processing device 402 during execution thereof by the computer system 400, the main memory 404 and the processing device 402 also constituting computer-readable media.

The instructions may further be transmitted or received over a network 420 via the network interface device 408. While the computer-readable storage medium 428 is shown in an example implementation to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, solid-state memories, optical media, and magnetic media.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

As used herein, the singular forms "a," "an," and "the" include plural references unless the context clearly indicates otherwise. Thus, for example, reference to "a precursor" includes a single precursor as well as a mixture of two or more precursors; and reference to a "reactant" includes a single reactant as well as a mixture of two or more reactants, and the like.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%, such that "about 10" would include from 9 to 11.

The term "at least about" in connection with a measured quantity refers to the normal variations in the measured quantity, as expected by one of ordinary skill in the art in making the measurement and exercising a level of care commensurate with the objective of measurement and precisions of the measuring equipment and any quantities higher than that. In certain embodiments, the term "at least about" includes the recited number minus 10% and any quantity that is higher such that "at least about 10" would include 9 and anything greater than 9. This term can also be expressed as "about 10 or more." Similarly, the term "less than about" typically includes the recited number plus 10% and any quantity that is lower such that "less than about 10" would include 11 and anything less than 11. This term can also be expressed as "about 10 or less."

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to illuminate certain materials and methods and does not pose a limitation on scope. No language in the specification should be construed as indicating any non-claimed element as essential to the practice of the disclosed materials and methods.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A digital lithography system, comprising:

a first light source configured to emit a light beam toward a substrate via one or more optical elements;

a digital micro-mirror device (DMD) configured to receive the light beam and form an output light beam, wherein the output light beam is emitted from the DMD along a first optical path toward the substrate, wherein the first optical path has a first optical length from the DMD to a surface of the substrate; and an imaging device configured to capture an image of the substrate illuminated at least in part by the light beam via a second optical path, wherein the second optical path has a second optical length from the surface of the substrate to the imaging device, wherein the first optical length and the second optical length are unequal; and a movable lens along a shared portion of the first optical path and the second optical path, wherein the movable lens is configured to move between a first position and a second position, wherein the output light beam emitted from the DMD is focused on the surface of the substrate when the movable lens is in the first position, and wherein the image of the substrate captured by the imaging device is focused when the movable lens is in the second position.

2. The digital lithography system of claim 1, wherein the movable lens is caused to be in the first position during patterning operations performed with respect to the substrate and is caused to be in the second position during imaging operations performed with respect to the substrate.

3. The digital lithography system of claim 1, further comprising:

an actuator configured to move the movable lens between the first position and the second position.

4. The digital lithography system of claim 1, further comprising:

a controller configured to:

receive the captured image of the substrate;

determine whether the captured image of the substrate is in focus; and cause the movable lens to move responsive to determining the captured image of the substrate is not in focus.

5. The digital lithography system of claim 1, wherein the movable lens comprises at least one of an optical lens, a spherical lens, or an aspherical lens.

6. The digital lithography system of claim 1, wherein a difference in length between the first optical length and the second optical length causes the captured image of the substrate to be out of focus when the output light beam emitted from the DMD is in focus on the surface of the substrate and further causes the output light beam emitted from the DMD to be out of focus on the surface of the substrate when the captured image of the substrate is in focus.

7. The digital lithography system of claim 1, wherein the one or more optical elements comprises:

an arrangement of lenses configured to focus the light beam along the optical path toward the substrate;

a first prism configured to direct the light beam along the optical path toward the DMD via a mirror and direct the output light beam along the optical path toward the substrate; and a second prism configured to pass the output light beam along the optical path toward the substrate and direct light reflected from the substrate toward the imaging device.

8. The digital lithography system of claim 1, further comprising:

a second light source disposed proximate the substrate, wherein the second light source is configured to further illuminate the substrate.

9. The digital lithography system of claim 1, wherein the substrate comprises at least one of glass, a reflective material, a metal, a chrome, a polymer, a crystal, or an oxide.

10. The digital lithography system of claim 1, wherein the DMD is configured to output a patterned light beam during patterning operations, wherein the patterned light beam is emitted along the optical path toward the substrate, the digital lithography system further comprising:

an actuator configured to move at least one movable lens to focus the patterned light beam on the substrate during the patterning operations and further configured to move the at least one movable lens to focus the imaging device during imaging operations.

11. A system, comprising:

a light source configured to emit a beam of light;

a digital micro-mirror device (DMD) configured to receive the beam of light and form an output light beam;

one or more optical elements configured to direct the output light beam along a first optical path from the DMD to a surface of a substrate, wherein the first optical path has a first optical length from the DMD to the surface of the substrate; and an image sensor configured to capture an image of the substrate illuminated by the output light beam via a second optical path, wherein the second optical path has a second optical length from the surface of the substrate to the image sensor, wherein the first optical length and the second optical length are unequal; and a lens along a shared portion of the first optical path and the second optical path, wherein the output light beam emitted from the DMD is focused on the surface of the substrate when the lens is in a first position, and wherein the image of the substrate captured by the image sensor is focused when the lens is in a second position.

12. The system of claim 11, wherein the lens is caused to be in the first position during patterning operations performed with respect to the substrate and is caused to be in the second position during imaging operations performed with respect to the substrate.

13. The system of claim 11, further comprising:

an actuator configured to move the lens between the first position and the second position.

14. The system of claim 11, wherein a difference in length between the first optical length and the second optical length causes the captured image of the substrate to be out of focus when the output light beam emitted from the DMD is in focus on the surface of the substrate and further causes the output light beam emitted from the DMD to be out of focus on the surface of the substrate when the captured image of the substrate is in focus.

15. The system of claim 11, wherein the DMD is configured to output a patterned light beam during patterning operations, wherein the patterned light beam is emitted along the optical path toward the substrate, the system further comprising:

an actuator configured to move at least one movable lens to focus the patterned light beam on the substrate during the patterning operations and further configured to move the at least one movable lens to focus the image sensor during imaging operations.

16. A method, comprising:

illuminating, by a first light source configured to output a beam of light, at least a portion of a substrate with an output light beam via a first optical path, wherein the output light beam is formed by a digital micro-mirror device (DMD), wherein the first optical path has a first optical length from the DMD to a surface of the substrate;

capturing, by an imaging device, a first image of the substrate illuminated by the output light beam via a second optical path, wherein the second optical path has a second optical length from the surface of the substrate to the imaging device;

determining, by a processing device, whether the first image of the substrate comprises a Moire effect;

responsive to determining that the first image of the substrate comprises the Moire effect, adjusting the second optical path length, wherein the first optical path length and the adjusted second optical path length are unequal; and causing a movable lens disposed along a shared portion of the first optical path and the second optical path to move between a first position and a second position, wherein the output light beam emitted from the DMD is focused on the surface of the substrate when the movable lens is in the first position, and wherein the image of the substrate captured by the imaging device is focused when the movable lens is in the second position.

17. The method of claim 16, wherein the movable lens is caused to be in the first position during patterning operations performed with respect to the substrate and is caused to be in the second position during imaging operations performed with respect to the substrate.

18. The method of claim 16, further comprising:

causing the movable lens to move to the second position;

capturing, by the imaging device, a second image of the substrate, wherein a difference in length between the first optical length and the second optical length causes the captured second image of the substrate to be in focus when the movable lens is in the second position;

performing an alignment operation with respect to the substrate based on the second image of the substrate;

causing the movable lens to move to a third position associated with the first optical path length to focus the output light beam onto the substrate, wherein the difference in length between the first optical length and the second optical length causes the output light beam to be in focus on the surface of the substrate when the movable lens is in the third position; and performing an exposure operation with respect to the substrate by emitting the output light beam onto the substrate, wherein the output light beam is focused by the movable lens in the third position.

19. The method of claim 16, further comprising:

further illuminating, by a second light source, the substrate, wherein the second light source is disposed proximate the substrate.

20. The method of claim 16, wherein the substrate comprises at least one of glass, a reflective material, a metal, a chrome, a polymer, a crystal, or an oxide.

* * * * *